United States Patent
Johnson et al.

(10) Patent No.: US 6,880,349 B2
(45) Date of Patent: Apr. 19, 2005

(54) RACK-MOUNTED EQUIPMENT COOLING

(75) Inventors: Richard J. Johnson, Chesterfield, MO (US); Robert C. Pfleging, Saint Peters, MO (US); Timothy J. Anderson, O'Fallon, MO (US); Daniel C. Kroupa, Maryland Heights, MO (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 10/674,077

(22) Filed: Sep. 29, 2003

(65) Prior Publication Data

US 2004/0129005 A1 Jul. 8, 2004

Related U.S. Application Data

(62) Division of application No. 10/121,313, filed on Apr. 12, 2002, now Pat. No. 6,668,565.

(51) Int. Cl.$^7$ .............................................. F25D 17/06
(52) U.S. Cl. ............................. 62/89; 62/255; 62/259.2
(58) Field of Search ..................... 62/89, 255, 259.2, 62/256, 184; 165/80.3; 361/695, 696, 697; 454/184

(56) References Cited

U.S. PATENT DOCUMENTS

| | | | | |
|---|---|---|---|---|
| 4,911,231 A | * | 3/1990 | Horne et al. .......... | 165/104.34 |
| 5,173,819 A | * | 12/1992 | Takahashi et al. ........ | 360/97.03 |
| 5,206,772 A | * | 4/1993 | Hirano et al. ............ | 360/98.01 |
| 5,409,419 A | * | 4/1995 | Euchner et al. ............ | 454/184 |
| 5,422,767 A | * | 6/1995 | Hatchett et al. ......... | 360/98.01 |
| D375,725 S | * | 11/1996 | Dodson ....................... | 257/706 |
| 5,673,029 A | * | 9/1997 | Behl et al. .................... | 340/635 |
| 6,075,698 A | * | 6/2000 | Hogan et al. ............... | 361/695 |
| 6,185,065 B1 | * | 2/2001 | Hasegawa et al. ....... | 360/97.02 |
| 6,185,097 B1 | * | 2/2001 | Behl ......................... | 361/695 |

FOREIGN PATENT DOCUMENTS

JP            405332568 A   * 12/1993

* cited by examiner

*Primary Examiner*—William E Tapolcai
*Assistant Examiner*—Mohammad Ali
(74) *Attorney, Agent, or Firm*—Shane H. Hunter, Esq.; Mintz, Levin

(57) ABSTRACT

A gas distribution unit for use in a rack, that holds rack-mounted equipment that produces heat during operation, includes a housing defining a cavity, an exhaust port in a top wall of the housing, and at least one intake port configured to provide fluid communication between the cavity and a volume of gas external to the housing, the at least one intake port being at least partially laterally displaced relative to the exhaust port, the housing being configured to be disposed in and coupled to the rack and to direct gas from the cavity substantially directly upward through the exhaust port when coupled to the rack, and at least one fan coupled to and disposed within the housing and configured to draw gas through the at least one intake port, and to force the drawn-in gas out of the gas distribution unit through the exhaust port.

8 Claims, 4 Drawing Sheets

RACK-MOUNTED EQUIPMENT COOLING

This application is a division of application Ser. No. 10/121,313, filed Apr. 12, 2002, now U.S. Pat. No. 6,668,565.

FIELD OF THE INVENTION

The invention relates to cooling of rack-mounted devices.

BACKGROUND OF THE INVENTION

Each year in the communications and information technology industries, more equipment is arranged to be housed in rackmount enclosures. Equipment housed in these rackmount enclosures produces heat, in large part due to the number of transistors in this equipment. Moore's Law regarding transistors has held true since Intel® chairman Gordon Moore first proposed this law in 1965: the number of transistors on a micro chip will double every 18 months. The number of transistors is proportional to the thermal load each chip produces, and these chips are prevalent in rack-mounted equipment. Furthermore, operational system advances have allowed more chips to be used in multiprocessing applications, making each server produce even more heat. Thus, technological advances in chip design result in more heat being produced than in prior rack-mounted devices. Heat is undesirable as it affects performance and reliability of the rack-mounted components, e.g., including causing complete failures, and affects the useful life of the components. Often, the heat produced by the rack-mounted components is not evenly distributed in the rack. Unevenly distributed loads in the rack result in uneven heat production, or "hot spots."

SUMMARY OF THE INVENTION

In general, in an aspect, the invention provides a gas distribution unit for use in a rack that holds rack-mounted equipment that produces heat during operation. The gas distribution unit includes a housing defining a cavity, an exhaust port in a top wall of the housing, and at least one intake port configured to provide fluid communication between the cavity and a volume of gas external to the housing, the at least one intake port being at least partially laterally displaced relative to the exhaust port, the housing being configured to be disposed in and coupled to the rack and to direct gas from the cavity substantially directly upward through the exhaust port when coupled to the rack, and at least one fan coupled to and disposed within the housing and configured to draw gas through the at least one intake port, and to force the drawn-in gas out of the gas distribution unit through the exhaust port.

Implementations of the invention may include one or more of the following features. The exhaust port is defined adjacent a front edge of the housing. The housing has a curved transition between a bottom wall and a front side wall. The gas distribution unit further includes a plenum boot connected to the housing enclosing the at least one intake hole. The boot comprises a flexible material. An end of the boot that is displaced from the housing is configured to be attached to a surface defining a cool-gas port that provides access to a source of cool gas, the displaced end of the boot being configured to surround a perimeter of the cool-gas port.

Implementations of the invention may also include one or more of the following features. The housing is configured to be mounted into the rack such that a front wall of the housing is disposed adjacent to a front wall of the rack. The housing includes an interior wall that divides the cavity into a plurality of sub-cavities, and wherein the at least one fan includes at least one fan disposed within each sub-cavity. The gas distribution unit further includes multiple power inputs and a fail-over module electrically coupling the power inputs to the fans, the fail-over module being configured to disconnect a first of the power inputs from a first fan and connect a second of the power inputs to the first fan in response to a loss of power on the first power input. The at least one intake port includes at least one intake port for each sub-cavity, each intake port being associated with a corresponding fan, and wherein the fans each include a ring of fan blades configured and disposed to surround a perimeter of the corresponding intake port, each fan being configured to rotate the ring to draw gas through the corresponding intake port into an interior of the fan and to force the drawn-in gas radially outward through the ring. The gas distribution unit further includes a filter apparatus coupled to the housing and configured to filter gas drawn into the at least one intake port by the at least one fan.

In general, in another aspect, the invention provides a modular gas distribution unit for use in a rack that holds rack-mounted equipment that produce heat during operation, the rack-mounted equipment having corresponding fronts. The gas distribution unit includes in combination a housing, a fan connected to the housing and configured to draw gas from a first region external to the housing and force the gas from the first region into a second region internal to the housing, means for directing the gas forced into the second region upward adjacent the fronts of the rack-mounted equipment, and means for guiding cool gas from a source of the cool gas to the first region, the means for guiding being configured to guide the cool gas for adjustable distances to accommodate different separations between the means for directing and the source of cool gas.

Implementations of the invention may include one or more of the following features. The means for guiding includes a plenum comprising a flexible material. The means for directing includes an interior wall of the housing dividing a cavity, defined by the housing, into sub-cavities, the gas distribution unit further including at least another fan, with at least one fan disposed in each sub-cavity. The gas distribution unit further includes a redundant power distribution system coupled to provide power to the fans from multiple power sources, and to switch which power source provides power to a particular fan if the power source coupled to the particular fan fails. The gas distribution unit further includes a fan selector configured to control at least one of which combination of the fans will receive power and at which speed at least one of the fans will operate. The gas distribution unit further includes a filter apparatus coupled to the housing and configured and disposed to filter the cool gas.

In general, in another aspect, the invention provides a method of cooling equipment modules disposed in a rack of equipment modules, the modules being disposed above one another in the rack, the modules including fans to draw gas from fronts of the modules through the modules and to expel the gas from backs of the modules, the modules having corresponding fronts. The method includes drawing gas from a bottom region near a bottom of the rack, guiding the gas from the bottom region to a lower front region disposed below the fronts of the modules, and forcing the gas upward from the lower front region into an upper front region adjacent the fronts of the modules while inhibiting the gas from being initially forced into portions of the rack other than the upper front region.

Implementations of the invention may include one or more of the following features. The inhibiting comprises forcing the gas from the lower front region into the upper front region through an exhaust port configured to guide the gas into the upper front region. The guiding comprises inhibiting gas flow using a flexible plenum coupled to a surface defining an opening that provides access to cool gas, the drawing and forcing comprising drawing and forcing the cool gas. The method further includes filtering the gas drawn from the bottom region.

Various aspects of the invention may provide one or more of the following advantages. Higher volumes of colder air can be delivered to rack-mounted components than in other solutions. Reliability of rack-mounted components, e.g., servers, can be increased and hot spots reduced compared to previous designs. More components can be loaded into a rack without loss of reliability. Existing racks can be retrofitted to provide better cooling of rack-mounted components. A compact, high throughput, modular apparatus with few moving parts can be provided to new or existing racks to cool rack-mounted components. Electrical and mechanical failures of a rack-cooling apparatus are guarded against, e.g., with electrical and mechanical redundancy. Cooled air, and/or cooler-than ambient air, can be provided directly to rack-mounted equipment. The invention reduces/minimizes mixing of conditioned air with ambient air and may provide filtration. Variable amounts of cooling may be provided in response to variations of temperature and power consumption of rack-mounted components.

These and other advantages of the invention, along with the invention itself, will be more fully understood after a review of the following figures, detailed description, and claims.

DETAILED DESCRIPTION OF PREFERRED EMBODIMENTS

At least some embodiments of the invention provide techniques for cooling rack-mounted equipment. Embodiments of the invention include a modular, self-contained unit for cooling rack-mounted equipment where the unit has multiple fans for drawing air in through at least one input port and forcing the air out at least one exhaust port. The exhaust port is disposed at one end of the unit and directs the forced air upward such that cool air can be forced upward along an end of an enclosed rack of equipment. An exemplary unit has two fans, two input ports, and two exhaust ports. The input ports are designed to mate with the fans to permit the fans to draw air, e.g., from around the rack, from the space beneath the rack, or through an opening in a floor on which the rack rests. Using this unit in a room with an elevated floor under which cool air is provided, the unit can draw cool air in the input ports and force the cool air out of the exhaust ports upward toward the rack-mounted equipment. The dual fans provide mechanical redundancy such that if one fan fails, air will still flow as long as the other fan still operates. Electrical circuitry for driving the fans is also redundant to guard against downtime due to electrical failures. Other embodiments are within the scope of the invention.

Figure 1:
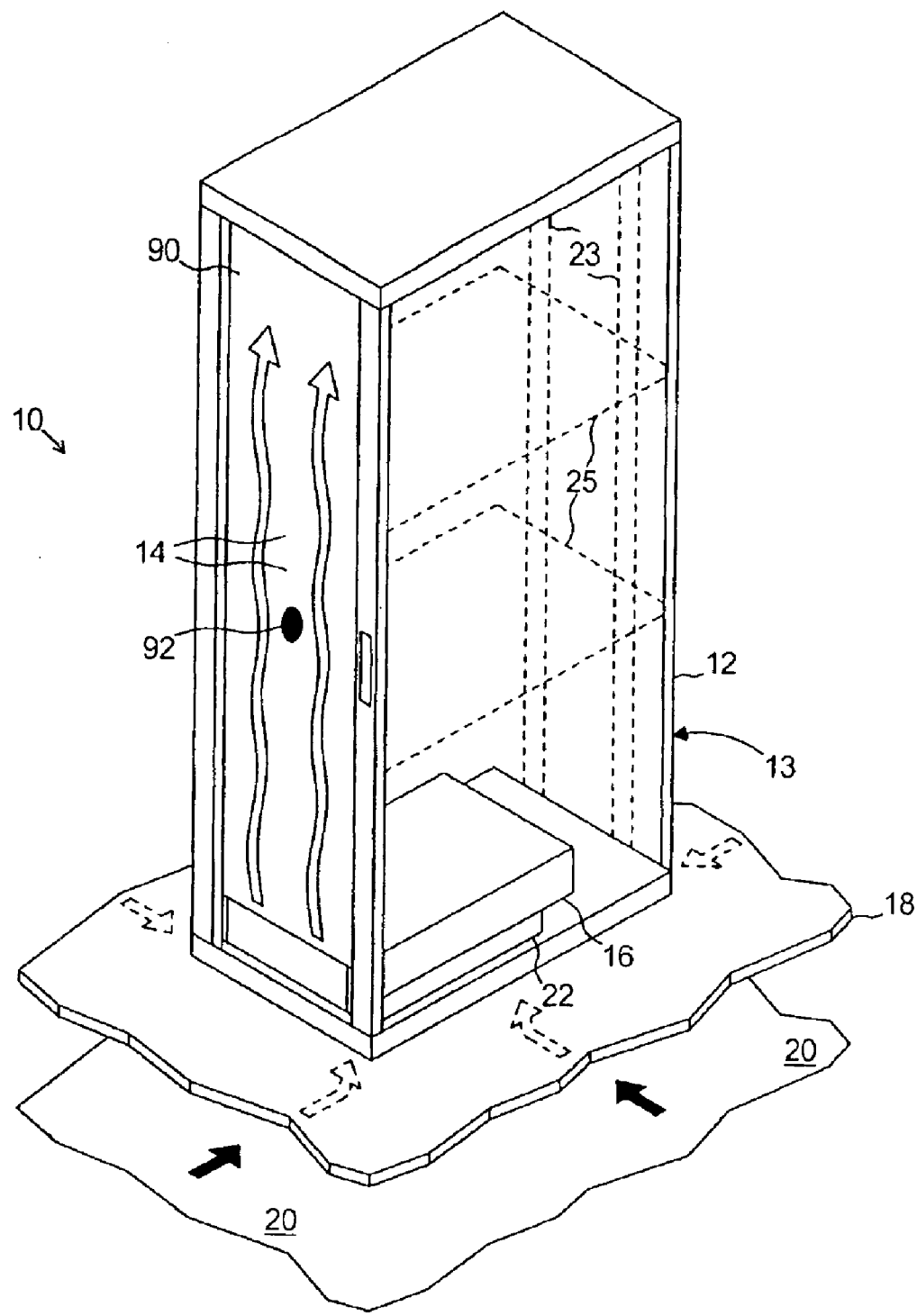
FIG. 1 is a perspective view of a rack-mounted equipment system.

Referring to FIG. 1, rack-mounted equipment system 10 includes a rack 12, multiple rack-mounted components 14, and a gas (e.g., air) distribution unit 16. The rack 12 includes a vented rear 13 and the components 14 may include fans configured to blow air from the components 14 out through the vented rear 13 of the rack 12. The rack 12 rests upon and is supported by a raised floor 18 disposed above a sub-floor 20. An air-conditioning unit (not shown) provides cold air (e.g., about 55–60° F.) between the floor 18 and the sub-floor 20.

Figure 5:
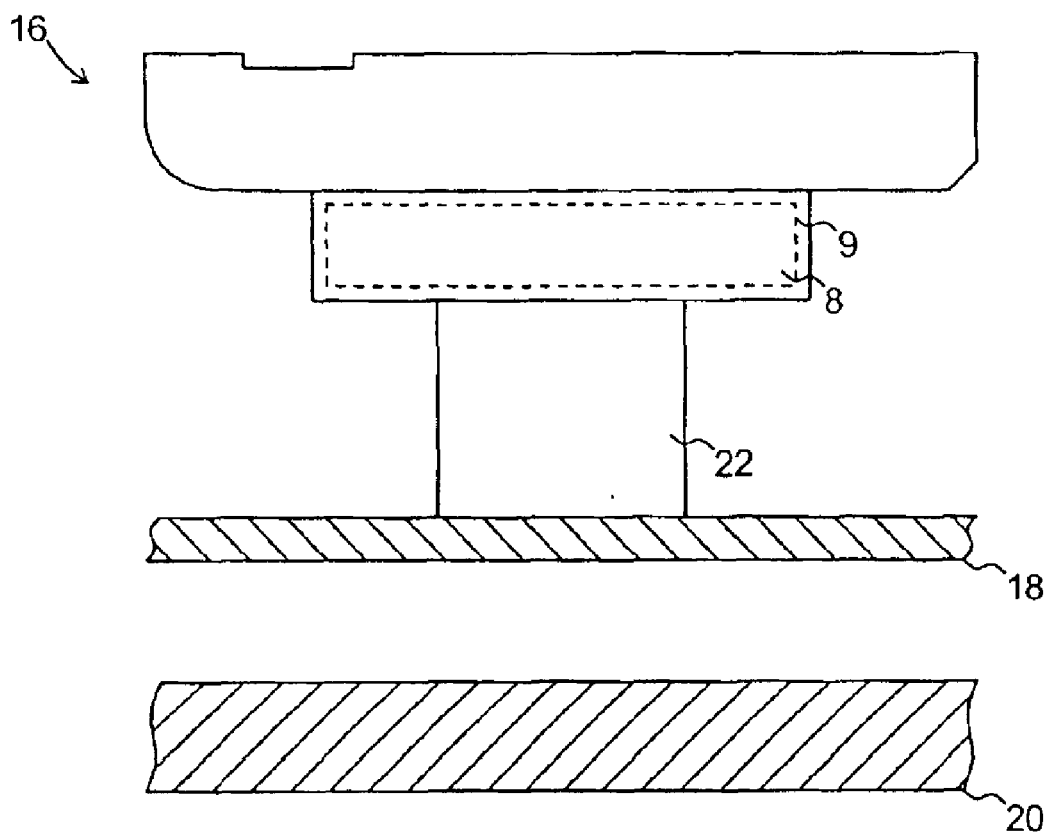
FIG. 5 is a simplified side view of the air distribution unit shown in FIG. 2, as assembled and disposed as shown in FIG. 1, and cross sections of two floors shown in FIG. 1.

Referring also to FIG. 5, a filter box 8 and a plenum boot 22 of the air distribution unit 16 connect other portions of the air distribution unit 16 to the floor 18 to draw and filter air from beneath the unit 16, including cool air from beneath the raised floor 18. The filter box 8 includes a removable filter 9 configured to filter particles from the air that may be harmful to the rack-mounted equipment 14. The boot 22 is removably coupled (e.g., with hook-and-loop fasteners) to the filter box 8 and is made of a flexible material such as nylon, rubber, or cloth, providing an adjustable length for the boot 22. The boot 22 is configured to have an expansive spring-force to make the boot 22 self-expanding, e.g., to couple to the floor 18. The boot 22 provides for guided fluid communication between the air distribution unit 16 and a region between the floors 18 and 20. The boot 22 provides a passageway for cool air that flows from between the floors 18, 20 through one or more openings in the raised floor 18, and one or more openings in the bottom of the rack 12. The boot 22 surrounds the opening(s) in the surface to which the boot 22 is attached (e.g., the bottom of the rack 12 or the floor 18). A gland plate at the bottom of the rack 12 can be removed to provide access to the floor 18. Cool air can pass through, and be guided by, the boot 22 to the filter box 8 of the air distribution unit 16. The boot 22 can be removed such that the bottom of the boot 22 is above the bottom of the rack 12, allowing ambient air near the bottom of the rack 12 to be drawn into the boot 22 or directly into the filter box 8.

Figure 2:
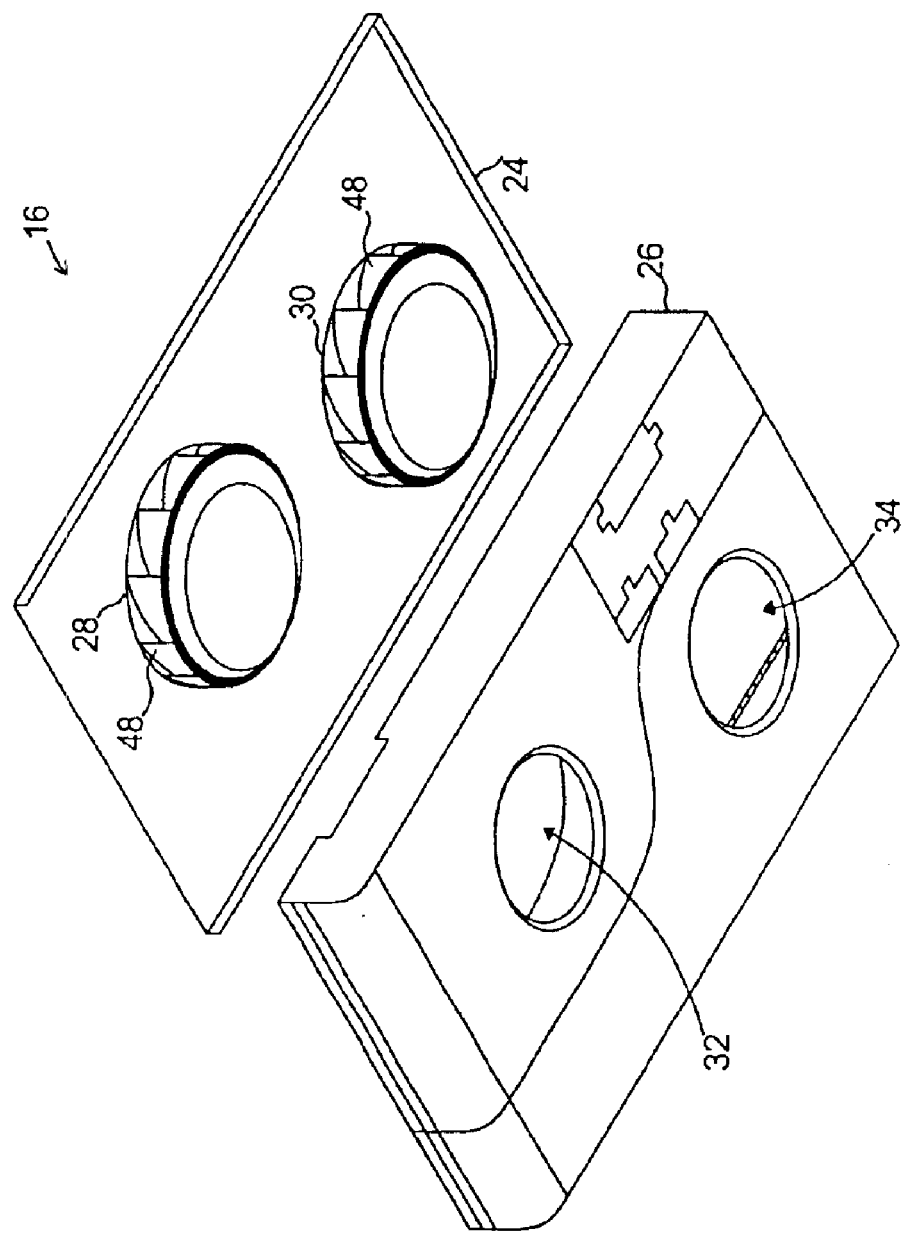
FIG. 2 is a bottom perspective view of a top, a bottom, and two fans of an air distribution unit of the system shown in FIG. 1.
Figure 3:
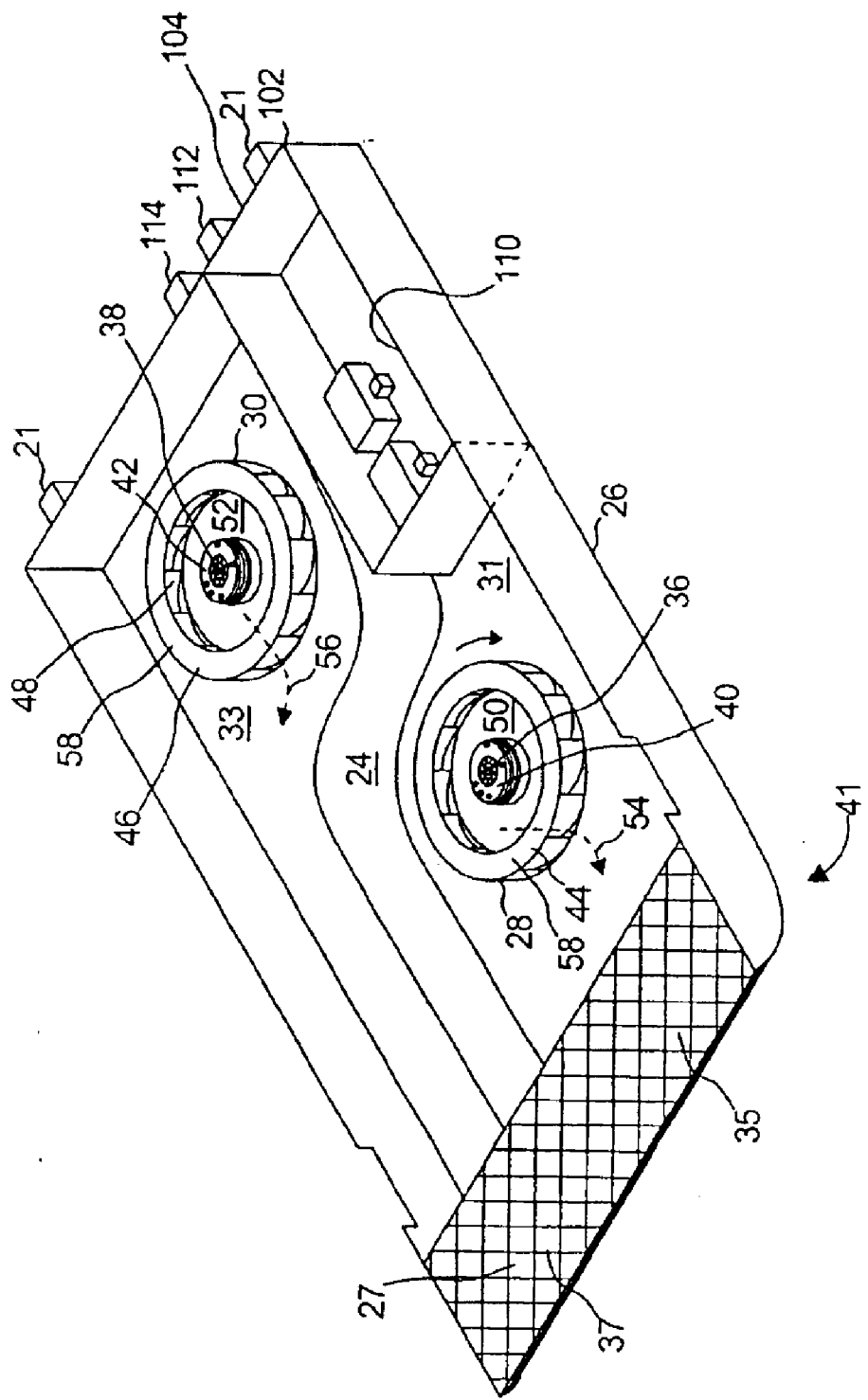
FIG. 3 is a top perspective view of the bottom and the two fans shown in FIG. 2.

Referring to FIGS. 2–3, the air distribution unit 16 includes a top or cover 24, a bottom 26, and two fans 28, 30. The bottom 26 is configured to mount to the rack, e.g., with tabs 21 that fit into mating receptacles on vertical rails 23 in the rack 12, such that the unit 16 is rack mountable. The tabs 21 may be adjusted to various locations on a back wall of the bottom 26 such that the location of the unit 16 in the rack 12 is adjustable (e.g., vertically within the rack 12). Alternatively, or additionally, to being rack mountable, the bottom 26 may be configured to rest upon trays 25 disposed within the rack 12 that are mounted to the rails 23 in the rack 12. The top 24 fits over and screws into the bottom 26 to cover the bottom 26 except for a grated end section 27. The top 24 and the bottom 26 are made of appropriate materials such as metal, plastic, or wood. The top 24 includes holes for attaching, e.g., screwing, the fans 28, 30 to the top 24. The top 24 further includes electrical lines for conveying power and electrical connectors for connecting to the fans 28, 30 to transfer power to the fans 28, 30.

The bottom 26 includes a dividing wall 29 that separates an interior chamber of the unit 16 into two smaller chambers 31, 33. The fans 28, 30 are mounted to the top 24, the top 24 is connected to the bottom 26, and the fans 28, 30 are configured for radially outward air flow from the fans 28, 30. With this arrangement, the only, or at least primary, opening in the chambers 31, 33 for air is an exhaust port 35 that is divided into two. An end 41 of the bottom 26 is curved to direct air flowing from the fans 28, 30 to the exhaust port 35 outwards from the interior of the unit 16 through and perpendicularly away from a plane of the top 24 and the grate 27. The bottom 26 also includes two openings or input ports 32, 34 for permitting air to flow through the bottom 26 into the unit 16, and more particularly into the fans 28, 30.

The fans 28, 30 are configured to be mounted to the top 24, e.g., with screws, in alignment with the input ports 32, 34 in the bottom 26 when the top 24 is connected to the bottom 26, e.g., by fastening the top 24 and bottom 26 together. The fans 28, 30 are also configured to receive air flowing through the input ports 32, 34. Further, the fans 28, 30 are configured to rotate about respective hubs 36, 38 that include internal motors (not shown), fixed top portions 40, 42 that mount to the top 24, and rotating lower portions 44, 46 that can rotate relative to the top portions 40, 42. The motors are configured to rotate the lower portions 44, 46 in a clockwise direction when viewed from above as in FIG. 3. The fans 28, 30 may be, e.g., model R2E220 fans made by EBM of Farmington, Conn. (although numerous other fans including fans made by other manufacturers are acceptable and can be used as the fans 28, 30, including to replace the R2E220 fans). The fans 28, 30 can have multiple speeds of operation to thereby force air (or other gases) out of the exhaust port 35.

Rings 58 of fins or blades 48 of the fans 28, 30 are angled relative to a radial direction of the fans 28, 30 such that rotation of the rings 58 by the motors will draw air through the input ports 32, 34 into internal regions 50, 52, of the fans 28, 30, that are in fluid communication with the input ports 32, 34. The rotation of the fans 28, 30 will force the drawn-in air out of the fans 28, 30 from the internal regions 50, 52, as indicated by arrows 54, 56, radially outward into the chambers 31, 33. Preferably, the internal regions 50, 52 span areas at least as large as areas spanned by the input ports 32, 34 such that air will flow only (or substantially only) into the unit 16 through the input ports 32, 34.

To supply power to the fans 28, 30, the bottom 26 includes two power ports 102, 104, connected to two switches 112, 114, via fail-over circuitry 110. The power ports 102, 104 are configured to receive power cord connectors, e.g., standard three-prong connectors, or other connectors as appropriate for the power being supplied. The fail-over circuitry 110 is configured to connect the port 102 to both of the switches 112, 114 in a normal mode. The circuitry 110 is further configured to detect a failure in power supply from the port 102 and, in response to the detected failure, couple the port 104 to the switches 112, 114, in a fail-over mode. The circuitry 110 is further configured to provide independent fusing of the fans 28, 30, such that if one of the fans 28, 30 fails, then only the other of the fans 28, 30 will receive operating power. The circuitry 110 also provides independent thermal protection of the fans 28, 30. If the winding of either of the fans 28, 30 gets too hot, then the circuitry 110 will shut that fan 28, 30 off. An indication can be provided showing that either or both of the fans 28, 30 have been shut off. The switches 112, 114 are coupled through lines running up the dividing wall 29, through connectors to the cover 24, through lines running along the cover 24, and through connectors to the fans 28, 30. The connectors can be, for example, quick-disconnect connectors.

The switches 112, 114 include respective buttons for selecting which, or both, of the fans 28, 30 will operate when the unit 10 is powered up. Pressing on the buttons will actuate/de-actuate the respective switches 112, 114. Actuating the switches 112, 114 causes the switches 112, 114 to close, coupling the fail-over circuitry 110 to the fans 28, 30, and de-actuating the switches 112, 114 causes the switches 112, 114 to open, producing a break in the coupling of the circuitry 110 to the fans 28, 30. The buttons, or separate selectors, may provide for selecting speed settings for either or both of the fans 28, 30 as appropriate.

Referring to FIGS. 1–3, assembly and placement of the air distribution unit 16 is relatively simple, can be performed quickly, and facilitates disassembly for repair or replacement of parts. The fans 28, 30 are screwed to the top 24, connecting the fans 28, 30 to the connectors for transferring power. The top 24, with the mounted fans 28, 30 is aligned with respect to the bottom 26 and snapped to the bottom 26, coupling corresponding electrical connectors on the top 24 and bottom 26 for transferring power to the fans 28, 30. The filter box 8 is secured, e.g., with screws, to the bottom 26. The filter box 8 can be unscrewed from the bottom 26, the top 24 can be unsnapped from the bottom 26, and the fans 28, 30 unscrewed from the top 24 as desired to repair or replace the fans 28, 30, clean the unit 16, or make any other adjustments or repairs desired. Alternatively, the unit 16 can be assembled such that the unit 16 is not easily disassembled, helping to improve reliability of, and inhibit tampering with, the unit 16.

The unit 16 is placed in the rack 12, connected to one or more sources of power, and arranged to draw air as desired. The unit 16 is put in the rack 12, e.g., by being mounted to the rack 12 (e.g., by inserting the tabs 21 in the rails 23) or rested on one of the trays 25 in the rack 12. The height of the unit 16 relative to the floor of the rack 12 may be adjusted by selecting which tab locations to use to mount the unit 16 to the rack 12 if multiple locations are provided. Power cords are connected to the power ports 102, 104, preferably to couple an AC power source (e.g., a wall socket or an Uninterruptible Power Supply outlet) to the port 102, and to couple a battery to the port 104. The filter box 8 is connected to the boot 22 with the boot 22 surrounding the perimeter of the filter box 8 to facilitate drawing cool air from between the floors 18, 20 into the air distribution unit 16. The boot 22 is connected to the bottom of the rack 12, or to the floor 18, surrounding a hole providing access to the area between the floors 18, 20. Alternatively, the boot 22 can be removed to permit drawing of air from below the rack 12 (that will be cooler than ambient air higher up) into the air distribution unit 16.

Figure 4:
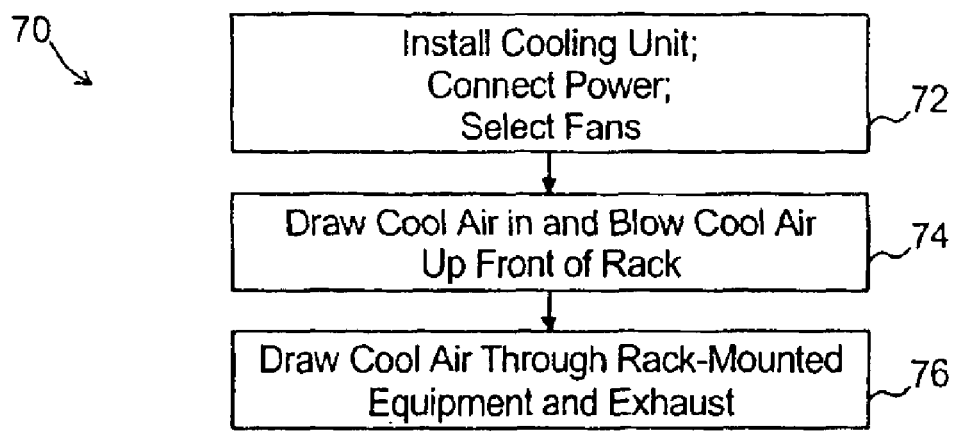
FIG. 4 is a block flow diagram of a process of cooling equipment mounted in the system shown in FIG. 1 using the air distribution unit shown in FIGS. 2–3.

In operation, referring to FIG. 4, with further reference to FIGS. 1–3, a process 70 for cooling the rack-mounted components 14 using the air distribution unit 16 includes the stages shown. The process 70, however, is exemplary only and not limiting. The process 70 can be altered, e.g., by having stages added, removed, or rearranged.

At stage 72, the air distribution unit 16 is installed in the rack 12. The air distribution unit 16 is placed at the bottom of the rack 12, e.g., by mounting the unit 16 to the rack 12 or placing the unit 16 on one of the trays 25 in the rack 12 (preferably the bottom-most mounting position or tray 25 of the rack 12). Power cords are connected to the air distribution unit 16 to provide power to the fans 28, 30. A user presses the buttons 112, 114 as desired to select one or both of the fans 28, 30 to receive power and at which speed each fan 28, 30 should operate (if the fan 28 and/or the fan 30 is configured for multiple-speed operation). A front door 90 of the rack 12 may be closed to provide a bounded channel 92 between the door 90 and the rack-mounted equipment 14. The door 90 may, however, not be closed or not be present. Preferably, the fans 28, 30 blow air at a sufficient speed such that the blown air remains substantially in an air curtain approximately the size of the channel 92, with little loss of blown air to the environment around the rack 12.

At stage 74, the air distribution unit 16 is powered on to produce a flow of cool air into the rack 12. The fans 28, 30 turn, thereby drawing cool air from between the raised floor 18 and the sub-floor 20 into the air distribution unit 16, and more particularly into the internal regions 50, 52 of the fans 28, 30. The cool air is forced by the fans 28, 30 from the internal regions 50, 52 into the chambers 31, 33. The cool air is pushed from the closed chambers 31, 33 out of the unit 16 through the exhaust port 35 upward, away from the bottom 26 through and away from the top 24. The expelled cool air is blown up the channel 92 along fronts of the rack-mounted components.

At stage 76, the cool air in the channel 92 is drawn through the rack-mounted components 14. Fans at the rears of the components blow air from the components 14 out the vented back 13 of the rack 12. This draws the cool air from the channel 92 into and through the components 14, cooling the components 14, and in particular, transistors of the components 14.

Other embodiments are within the scope and spirit of the appended claims. For example, only one fan, or more than two fans, may be used in the unit 16. A single power source can be coupled to the unit 16. Air could be forced upward at the backs of the equipment 14. Also, the unit 16 may pump air of varying temperatures, including hot air. The distribution unit 16 may be configured to distribute various types of gases in addition to air, with changes to the materials noted above being made as appropriate. Further, a controller can be provided in the distribution unit 16 to regulate fan speed. The controller can be coupled to temperature and/or power monitors that provide information regarding temperature and power consumption, respectively, of the rack-mounted components 14. In response to the monitored temperature and/or power consumption, the controller could control the speed of the fans 28, 30 to help compensate for temperature and/or power consumption variations to thereby help maintain the temperature of the components within a desired temperature range. Also, a wire-management device, such as a bracket, may be provided below the unit 16, e.g., to reduce or limit spring forces produced by bending wires to fit in the rack 12 beneath the unit 16. Thus, any such spring forces will not force the unit 16 undesirably, e.g., out of the rack 12 if there is no front door on the rack 12.

What is claimed is:

1. A method of cooling equipment modules disposed in a rack of equipment modules, the modules being disposed above one another in the rack, the modules including fans to draw gas from fronts of the modules through the modules and to expel the gas from backs of the modules, the modules having corresponding fronts, the method comprising:

drawing gas from a bottom region near a bottom of the rack;

guiding the gas to a lower front region disposed below the fronts of the modules; and pushing the gas upward from the lower front region into an upper front region adjacent the fronts of the modules while inhibiting the gas from initially flowing into portions of the rack other than the upper front region.

2. The method of claim 1 wherein the inhibiting comprises containing the gas upstream from the upper front region.

3. The method of claim 1 wherein the guiding comprises using a flexible plenum coupled to a surface defining an opening that provides access to cool gas, the drawing and pushing comprising drawing and pushing the cool gas.

4. The method of claim 1 further comprising filtering the gas drawn from the bottom region.

5. A method of cooling equipment modules disposed in a rack of equipment modules, the modules being disposed above one another in the rack, the modules including fans to draw gas from fronts of the modules through the modules and to expel the gas from backs of the modules, the modules having corresponding fronts, the method comprising:

inducing gas from a bottom region near a bottom of the rack to flow into a housing disposed in the rack;

guiding the gas from the bottom region vertically through an intake port of the housing and horizontally through the housing to a lower front region disposed below the fronts of the modules; and urging the gas upward from the lower front region through an output port of the housing into an upper front region adjacent the fronts of the modules while inhibiting the gas from initially flowing into portions of the rack other than the upper front region.

6. The method of claim 5 wherein the inhibiting comprises bounding the gas with the housing and the urging comprises urging the gas from the lower front region into the upper front region through an exhaust port of the housing configured to direct the gas into the upper front region.

7. The method of claim 5 wherein the vertically guiding comprises using a flexible plenum coupled to a surface defining an opening that provides access to cool gas, the inducing and urging comprising inducing and urging the cool gas.

8. The method of claim 5 further comprising filtering the gas induced to flow from the bottom region.

* * * * *